United States Patent
Lee et al.

(10) Patent No.: US 9,922,876 B1
(45) Date of Patent: Mar. 20, 2018

(54) INTERCONNECT STRUCTURE AND FABRICATING METHOD THEREOF

(71) Applicant: MACRONIX International Co., Ltd., Hsinchu (TW)

(72) Inventors: Hong-Ji Lee, Hsinchu (TW); Min-Hsuan Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/414,386

(22) Filed: Jan. 24, 2017

(51) Int. Cl.
*H01L 23/52* (2006.01)
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76883* (2013.01); *H01L 21/76865* (2013.01); *H01L 23/528* (2013.01); *H01L 23/5226* (2013.01); *H01L 23/53223* (2013.01); *H01L 23/53266* (2013.01)

(58) Field of Classification Search
CPC ............. H01L 23/5226; H01L 23/528; H01L 21/76883; H01L 23/53223; H01L 23/53266; H01L 21/76865
USPC ...................................................... 257/751
See application file for complete search history.

(56) References Cited

U.S. PATENT DOCUMENTS

| | | | | |
|---|---|---|---|---|
| 5,364,817 A | * | 11/1994 | Lur | H01L 21/28512 257/763 |
| 5,371,410 A | * | 12/1994 | Chen | H01L 21/76844 257/750 |
| 6,040,627 A | * | 3/2000 | Harada | H01L 21/76838 257/750 |
| 6,156,639 A | * | 12/2000 | Fukao | H01L 21/76838 257/763 |
| 6,255,226 B1 | * | 7/2001 | Zheng | H01L 21/76883 257/E21.311 |
| 2012/0112271 A1 | | 5/2012 | Manabe | |

OTHER PUBLICATIONS

"Office Action of Taiwan Counterpart Application," dated Jul. 18, 2017, p. 1-p. 3.

* cited by examiner

*Primary Examiner* — Luan C Thai
(74) *Attorney, Agent, or Firm* — J.C. Patents

(57) ABSTRACT

An interconnect structure including a substrate, a dielectric layer, a first conductive pattern, and a second conductive pattern is provided. The dielectric layer is disposed on the substrate and has an opening. The first conductive pattern is disposed in the opening. The second conductive pattern is disposed on the first conductive pattern and exposes an exposed portion of the first conductive pattern. The exposed portion of the first conductive pattern has a notch.

17 Claims, 3 Drawing Sheets

INTERCONNECT STRUCTURE AND FABRICATING METHOD THEREOF

BACKGROUND OF THE INVENTION

Field of the Invention

The invention relates to a conductive structure and a fabricating method thereof, and more particularly relates to an interconnect structure and a fabricating method thereof.

Description of Related Art

As the integrity of integrated circuits (ICs) is increased with the development of the semiconductor industry, the chip surface is no longer sufficient for forming the interconnect required. Thus, the multi-layer interconnect design gradually becomes necessary for many integrated circuits.

As the size of semiconductor devices decreases, the overlay window of the upper conductive device and the lower conductive device below in the multi-layer interconnect structure is reduced. For this reason, misalignment may occur easily. When the upper conductive device and the lower conductive device below in the multi-layer interconnect structure are misaligned, the upper conductive device may expose the lower conductive device below. Consequently, a bridging path may be created between adjacent two upper conductive devices by the exposed lower conductive device, which results in the defect of circuit bridging.

SUMMARY OF THE INVENTION

The invention provides an interconnect structure and a fabricating method thereof, which effectively prevent occurrence of a defect of circuit bridging.

The invention provides an interconnect structure, which includes a substrate, a dielectric layer, a first conductive pattern, and a second conductive pattern. The dielectric layer is disposed on the substrate and has an opening. The first conductive pattern is disposed in the opening. The second conductive pattern is disposed on the first conductive pattern and exposes an exposed portion of the first conductive pattern. The exposed portion of the first conductive pattern has a notch.

According to an embodiment of the invention, in the interconnect structure, a material of the first conductive pattern is W, Ti, TiN, Ta, or TaN, for example.

According to an embodiment of the invention, in the interconnect structure, the first conductive pattern is a plug or a wire, for example.

According to an embodiment of the invention, in the interconnect structure, a material of the second conductive pattern is AlCu, Al, or W, for example.

According to an embodiment of the invention, in the interconnect structure, the second conductive pattern is a wire or a plug, for example.

According to an embodiment of the invention, in the interconnect structure, a width of the second conductive pattern may be greater than, equal to, or less than a width of the first conductive pattern.

According to an embodiment of the invention, in the interconnect structure, the width of the second conductive pattern may be less than the width of the first conductive pattern, and the exposed portion of the first conductive pattern may be located at a side or two sides of the second conductive pattern.

According to an embodiment of the invention, in the interconnect structure, the exposed portion of the first conductive pattern may be located at the two sides of the second conductive pattern, and the exposed portion of the first conductive pattern may have the notch respectively at the two sides of the second conductive pattern.

According to an embodiment of the invention, in the interconnect structure, the notch may expose a portion of a sidewall of the opening.

According to an embodiment of the invention, in the interconnect structure, the exposed portion of the first conductive pattern exposed by the notch may have an inclined surface.

According to an embodiment of the invention, the interconnect structure further includes a first barrier layer. The first barrier layer is disposed between the first conductive pattern and the dielectric layer.

According to an embodiment of the invention, the interconnect structure further includes a second barrier layer. The second barrier layer is disposed between the second conductive pattern and the first conductive pattern and disposed between the second conductive pattern and the dielectric layer.

According to an embodiment of the invention, the interconnect structure further includes a third barrier layer. The third barrier layer is disposed on the second conductive pattern.

The invention provides a fabricating method of an interconnect structure, which includes the following steps. A dielectric layer is formed on a substrate. The dielectric layer has an opening. A first conductive pattern is formed in the opening. A second conductive pattern is formed on the first conductive pattern. The second conductive pattern exposes an exposed portion of the first conductive pattern. A notch is formed in the exposed portion of the first conductive pattern.

According to an embodiment of the invention, in the fabricating method of the interconnect structure, a forming method of the notch includes partially removing the exposed portion of the first conductive pattern by performing an etching process on the exposed portion of the first conductive pattern with the second conductive pattern as a mask.

According to an embodiment of the invention, in the fabricating method of the interconnect structure, an etching gas used in the etching process includes a chlorine gas and a protective gas. A content of the chlorine gas is 50 vol % to 96 vol % based on a total amount of the chlorine gas and the protective gas, for example.

According to an embodiment of the invention, in the fabricating method of the interconnect structure, the protective gas is $N_2$, $BCl_3$, $CHF_3$, $CH_4$, or a combination thereof, for example.

According to an embodiment of the invention, in the fabricating method of the interconnect structure, the etching gas further includes an inert gas.

According to an embodiment of the invention, in the fabricating method of the interconnect structure, the inert gas is argon or helium, for example.

According to an embodiment of the invention, in the fabricating method of the interconnect structure, during the etching process, a process pressure may be 2 mTorr to 30 mTorr, a source RF power may be 30 W to 1500 W, and a bias RF power may be 15 W to 850 W.

Based on the above, according to the interconnect structure of the invention and the fabricating method thereof, the exposed portion of the first conductive pattern exposed by the second conductive pattern has the notch for cutting the bridging path between the adjacent two second conductive patterns. Thus, the interconnect structure and the fabricating method of the invention can prevent occurrence of the defect of circuit bridging and effectively increase the overlay window of the second conductive pattern and the first conductive pattern.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1D are schematic cross-sectional views illustrating a fabricating method of an interconnect structure according to an embodiment of the invention.

Figure 1A:
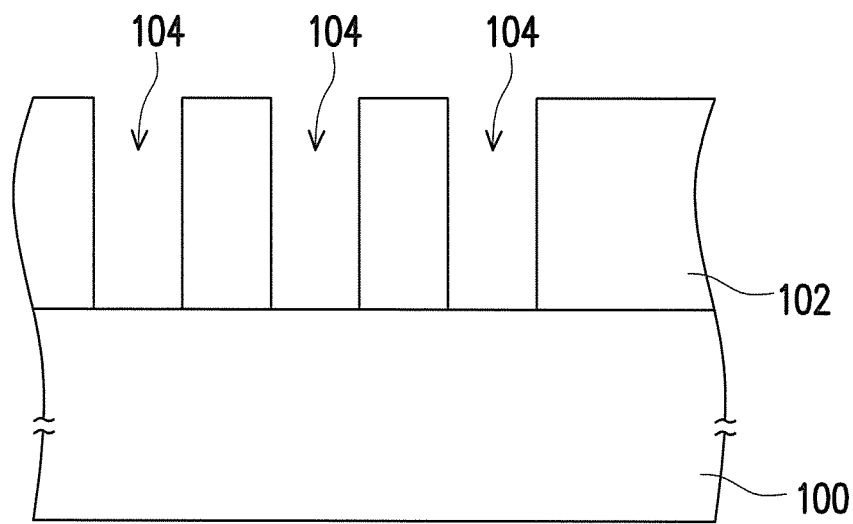
FIG. 1A to FIG. 1D are schematic cross-sectional views illustrating a fabricating method of an interconnect structure according to an embodiment of the invention.

Referring to FIG. 1A, a dielectric layer 102 is formed on a substrate 100, and the dielectric layer 102 has an opening 104. The substrate 100 may be a single-layer substrate or a multi-layer substrate that may have other layers (not shown) or semiconductor devices (not shown) formed thereon. A material of the dielectric layer 102 is silicon oxide, for example. A method of forming the dielectric layer 102 is chemical vapor deposition, for example. The opening 104 is a contact hole, a via hole, or a trench, for example. A method of forming the opening 104 includes performing a patterning process on the dielectric layer 102, for example.

Figure 1B:
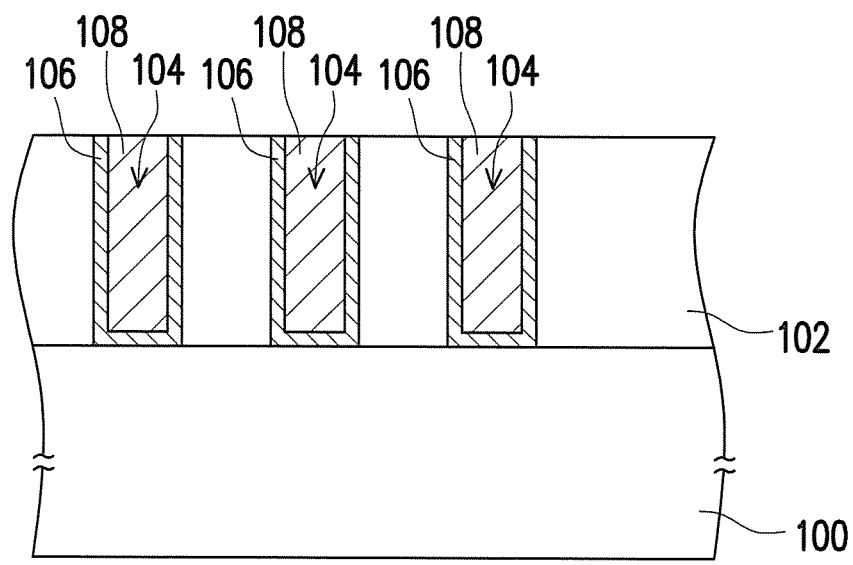

Referring to FIG. 1B, a barrier layer 106 is selectively formed on a surface of the opening 104. A material of the barrier layer 106 is Ti, TiN, Ta, TaN, or a combination of the foregoing, for example.

A conductive pattern 108 is formed on the barrier layer 106 in the opening 104. The barrier layer 106 may increase adhesion between the conductive pattern 108 and other layers. The conductive pattern 108 is a plug or a wire, for example, wherein the plug may be a contact plug or a via plug. A material of the conductive pattern 108 is W, Ti, TiN, Ta, or TaN, for example.

A method of forming the barrier layer 106 and the conductive pattern 108 is described as follows, for example. Nevertheless, the invention is not limited thereto. A barrier material layer (not shown) is formed conformally on the dielectric layer 102. A method of forming the barrier material layer is physical vapor deposition or chemical vapor deposition, for example. A conductive pattern material layer (not shown) is form on the barrier material layer to fill the opening 104. A method of forming the conductive pattern material layer is physical vapor deposition or chemical vapor deposition, for example. The conductive pattern material layer and the barrier material layer outside the opening 104 are removed. A method of removing the conductive pattern material layer and the barrier material layer outside the opening 104 is chemical mechanical polishing or etch back, for example.

Figure 1C:
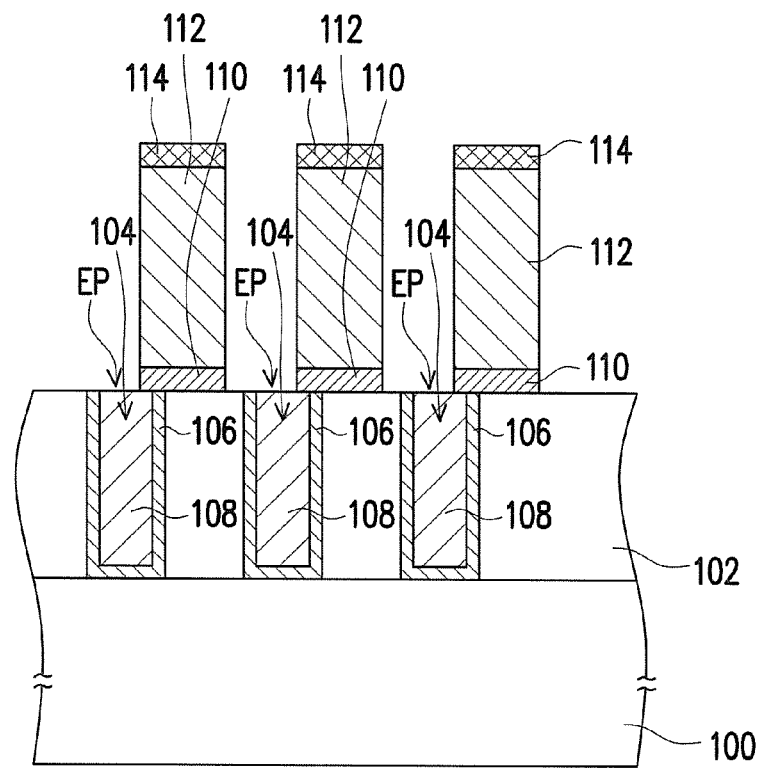

Referring to FIG. 1C, a barrier layer 110 is selectively formed on the conductive pattern 108. A material of the barrier layer 110 is Ti, TiN, Ta, TaN, or a combination of the foregoing, for example.

A conductive pattern 112 is formed on the barrier layer 110. The conductive pattern 112 exposes an exposed portion EP of the conductive pattern 108. The barrier layer 110 may increase adhesion between the conductive pattern 112 and other layers. In this embodiment, the exposed portion EP of the conductive pattern 108 may be located at a side of the conductive pattern 112. A width of the conductive pattern 112 may be greater than, equal to, or less than a width of the conductive pattern 108. The conductive pattern 112 is a wire or a plug, for example. The plug may be a contact plug or a via plug. A material of the conductive pattern 112 is AlCu, Al, or W, for example.

A barrier layer 114 is selectively formed on the conductive pattern 112. A material of the barrier layer 114 is Ti, TiN, Ta, TaN, or a combination of the foregoing, for example. The barrier layer 114 may increase adhesion between the conductive pattern 112 and the layers that are formed thereon in the subsequent processes.

A method of forming the barrier layer 114, the conductive pattern 112, and the barrier layer 110 is described as follows, for example. Nevertheless, the invention is not limited thereto. A stack structure of a barrier material layer (not shown), a conductive pattern material layer (not shown), and a barrier material layer (not shown) is formed sequentially on the dielectric layer 102. A method of forming the barrier material layers and the conductive pattern material layer is physical vapor deposition or chemical vapor deposition, for example. A patterning process is performed on the stack structure of the barrier material layer, the conductive pattern material layer, and the barrier material layer.

Figure 1D:
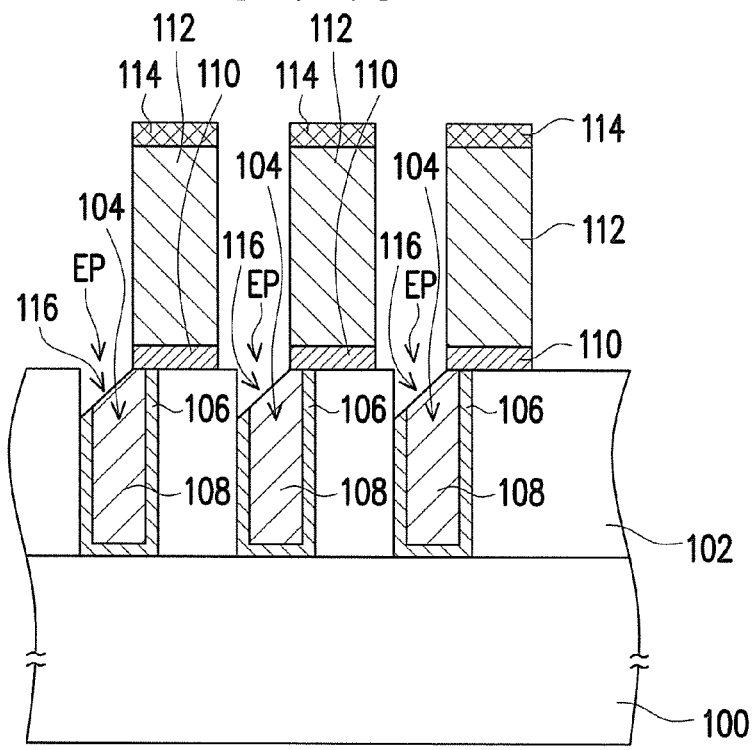

Referring to FIG. 1D, a notch 116 is formed in the exposed portion EP of the conductive pattern 108. Because the notch 116 can cut a bridging path between adjacent two conductive patterns 112, a defect of circuit bridging is prevented and an overlay window of the conductive pattern 112 and the conductive pattern 108 is increased effectively. The notch 116 may expose a portion of a sidewall of the opening 104. The exposed portion EP of the conductive pattern 108 exposed by the notch 116 may have an inclined surface.

A method of forming the notch 116 includes partially removing the exposed portion EP of the conductive pattern 108 by performing an etching process on the exposed portion EP of the conductive pattern 108 with the conductive pattern 112 as a mask, for example. The exposed portion EP of the conductive pattern 108 may be removed by in-situ etching. In the etching process performed on the exposed portion EP of the conductive pattern 108, a portion of the barrier layer 106 on the sidewall of the opening 104 may be removed at the same time. Moreover, in the etching process, an etching rate of the barrier layer 106 is higher than an etching rate of the exposed portion EP of the conductive pattern 108, for example.

An etching gas used in the etching process includes a chlorine gas and a protective gas. A content of the chlorine gas is 50 vol % to 96 vol % based on the total amount of the chlorine gas and the protective gas, for example. The protective gas is $N_2$, $BCl_3$, $CHF_3$, $CH_4$, or a combination thereof, for example. Moreover, the etching gas further includes an inert gas. The inert gas is argon or helium, for example.

In an embodiment, in the etching gas used in the etching process, a flow rate of the chlorine gas may be 15 sccm to 500 sccm, a flow rate of the $N_2$ may be 5 sccm to 20 sccm, a flow rate of the $BCl_3$ may be 0 sccm to 100 sccm, a flow rate of the $CHF_3$ may be 0 sccm to 20 sccm, a flow rate of the $CH_4$ may be 0 sccm to 15 sccm, and a flow rate of the inert gas (e.g., argon or helium) may be 0 sccm to 200 sccm. In another embodiment, in the etching gas used in the etching process, the flow rate of the chlorine gas may be 30 sccm to 100 sccm, the flow rate of the $N_2$ may be 10 sccm to 20 sccm, the flow rate of the $BCl_3$ may be 0 sccm to 5 sccm, the flow rate of the $CHF_3$ may be 0 sccm to 3 sccm, the flow rate of the $CH_4$ may be 0 sccm to 3 sccm, and the flow rate of the inert gas may be 50 sccm to 200 sccm.

Additionally, in an embodiment, during the etching process, a process pressure may be 2 mTorr to 30 mTorr, a source RF power may be 30 W to 1500 W, and a bias RF power may be 15 W to 850 W. In another embodiment, during the etching process, the process pressure may be 2 mTorr to 8 mTorr, the source RF power may be 300 W to 1000 W, and the bias RF power may be 100 W to 250 W.

Based on the above, it is known that in the fabricating method of the interconnect structure of the above embodiment, the exposed portion EP of the conductive pattern 108 exposed by the conductive pattern 112 has the notch 116 for cutting the bridging path between the adjacent two conductive patterns 112. Thus, by the fabricating method of the interconnect structure of the above embodiment, occurrence of the defect of circuit bridging can be prevented and the overlay window of the conductive pattern 112 and the conductive pattern 108 can be increased effectively.

The interconnect structure of this embodiment is described hereinafter with reference to FIG. 1D. Although the interconnect structure is fabricated by the aforementioned fabricating method in this embodiment, it is merely an example and the fabricating method of the interconnect structure of the invention is not limited thereto.

Referring to FIG. 1D, the interconnect structure includes a substrate 100, a dielectric layer 102, a conductive pattern 108, and a conductive pattern 112. The dielectric layer 102 is disposed on the substrate 100 and has an opening 104. The conductive pattern 108 is disposed in the opening 104. The conductive pattern 112 is disposed on the conductive pattern 108 and exposes an exposed portion EP of the conductive pattern 108. The exposed portion EP of the conductive pattern 108 has a notch 116. In this embodiment, the exposed portion EP of the conductive pattern 108 may be located at a side of the conductive pattern 112. Moreover, the interconnect structure further selectively includes at least one of a barrier layer 106, a barrier layer 110, and a barrier layer 114. The barrier layer 106 is disposed between the conductive pattern 108 and the dielectric layer 102 and may be further disposed between the conductive pattern 108 and the substrate 100. The barrier layer 110 is disposed between the conductive pattern 112 and the conductive pattern 108 and disposed between the conductive pattern 112 and the dielectric layer 102. The barrier layer 114 is disposed on the conductive pattern 112. Furthermore, the material, arrangement, forming method, and efficiency of each component in the interconnect structure have been specified in the above embodiment of the fabricating method of FIG. 1A to FIG. 1D, and thus are not repeated hereinafter.

Based on the above, it is known that, in the interconnect structure of the above embodiment, the exposed portion EP of the conductive pattern 108 exposed by the conductive pattern 112 has the notch 116 for cutting the bridging path between the adjacent two conductive patterns 112. Thus, the interconnect structure of the above embodiment is capable of preventing occurrence of the defect of circuit bridging and effectively increasing the overlay window of the conductive pattern 112 and the conductive pattern 108.

Figure 2:
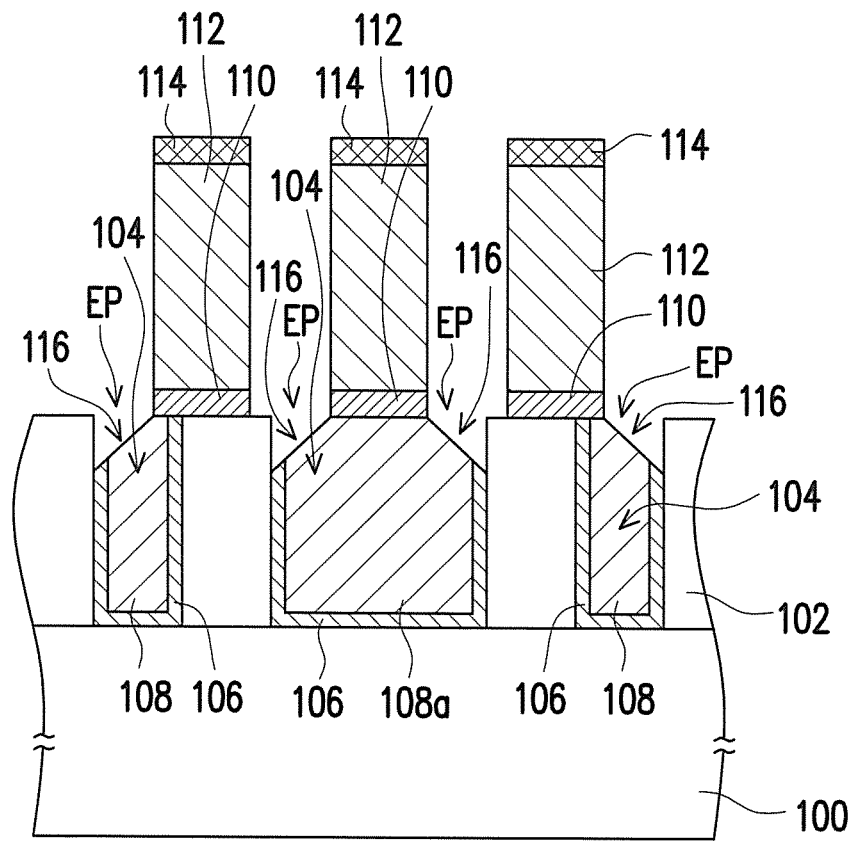
FIG. 2 is a schematic cross-sectional view of an interconnect structure according to another embodiment of the invention.

FIG. 2 is a schematic cross-sectional view of an interconnect structure according to another embodiment of the invention.

Referring to FIG. 1D and FIG. 2, a difference between the interconnect structure of FIG. 1D and the interconnect structure of FIG. 2 is described as follows. In the interconnect structure of FIG. 2, due to fabrication process variation, a width of a conductive pattern 108*a* is greater than the width of the conductive pattern 108, which causes the width of the conductive pattern 112 to be less than the width of the conductive pattern 108*a*, and the exposed portion EP of the conductive pattern 108*a* is located at two sides of the conductive pattern 112. Moreover, the exposed portion EP of the conductive pattern 108*a* may have the notch 116 respectively at two sides of the conductive pattern 112. In addition, the forming method and efficiency of the interconnect structure of FIG. 2 are similar to those of the interconnect structure of FIG. 1D, and identical components are assigned with the same reference numerals and thus detailed descriptions thereof are not repeated hereinafter.

In conclusion, according to the interconnect structure and the fabricating method of the above embodiment, the exposed portion of the lower conductive pattern exposed by the upper conductive pattern has the notch for cutting the bridging path between adjacent two upper conductive patterns. Thus, the interconnect structure and the fabricating method of the above embodiment can prevent occurrence of the defect of circuit bridging and effectively increase the overlay window of the upper conductive pattern and the lower conductive pattern.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. An interconnect structure, comprising:
   a substrate;
   a dielectric layer disposed on the substrate and having an opening;
   a first conductive pattern disposed in the opening; and
   a second conductive pattern disposed on the first conductive pattern and exposing an exposed portion of the first conductive pattern, wherein the exposed portion of the first conductive pattern has a notch, a width of the second conductive pattern is less than a width of the first conductive pattern, the exposed portion of the first conductive pattern is located at two sides of the second conductive pattern and has the notch respectively at the two sides of the second conductive pattern, and a bottommost surface of the second conductive pattern is higher than a topmost surface of the first conductive pattern.

2. The interconnect structure according to claim 1, wherein a material of the first conductive pattern comprises W, Ti, TiN, Ta, or TaN.

3. The interconnect structure according to claim 1, wherein the first conductive pattern comprises a plug or a wire.

4. The interconnect structure according to claim 1, wherein a material of the second conductive pattern comprises AlCu, Al, or W.

5. The interconnect structure according to claim 1, wherein the second conductive pattern comprises a wire or a plug.

6. The interconnect structure according to claim 1, wherein the notch exposes a portion of a sidewall of the opening.

7. The interconnect structure according to claim 1, wherein the exposed portion of the first conductive pattern exposed by the notch has an inclined surface.

8. The interconnect structure according to claim 1, further comprising a first barrier layer disposed between the first conductive pattern and the dielectric layer.

9. The interconnect structure according to claim 1, further comprising a second barrier layer disposed between the second conductive pattern and the first conductive pattern and disposed between the second conductive pattern and the dielectric layer.

10. The interconnect structure according to claim 1, further comprising a third barrier layer disposed on the second conductive pattern.

11. A fabricating method of an interconnect structure, the fabricating method comprising:
    forming a dielectric layer on a substrate, wherein the dielectric layer has an opening;
    forming a first conductive pattern in the opening;
    forming a second conductive pattern on the first conductive pattern, wherein the second conductive pattern exposes an exposed portion of the first conductive pattern; and
    forming a notch in the exposed portion of the first conductive pattern,
    wherein a width of the second conductive pattern is less than a width of the first conductive pattern, the exposed portion of the first conductive pattern is located at two sides of the second conductive pattern and has the notch respectively at the two sides of the second conductive pattern, and a bottommost surface of the second conductive pattern is higher than a topmost surface of the first conductive pattern.

12. The fabricating method according to claim 11, wherein a forming method of the notch comprises:
    partially removing the exposed portion of the first conductive pattern by performing an etching process on the exposed portion of the first conductive pattern with the second conductive pattern as a mask.

13. The fabricating method according to claim 12, wherein an etching gas used in the etching process comprises a chlorine gas and a protective gas, and a content of the chlorine gas is 50 vol % to 96 vol % based on a total amount of the chlorine gas and the protective gas.

14. The fabricating method according to claim 13, wherein the protective gas comprises $N_2$, $BCl_3$, $CHF_3$, $CH_4$, or a combination thereof.

15. The fabricating method according to claim 13, wherein the etching gas further comprises an inert gas.

16. The fabricating method according to claim 15, wherein the inert gas comprises argon or helium.

17. The fabricating method according to claim 12, wherein during the etching process, a process pressure is 2 mTorr to 30 mTorr, a source RF power is 30 W to 1500 W, and a bias RF power is 15 W to 850 W.

* * * * *